United States Patent
Nah et al.

(10) Patent No.: US 7,116,299 B2
(45) Date of Patent: Oct. 3, 2006

(54) LIQUID CRYSTAL DISPLAY DEVICE

(75) Inventors: Keun-Shik Nah, Incheon (KR); Kwang-Hyun La, Anyang (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/063,640

(22) Filed: Feb. 24, 2005

(65) Prior Publication Data

US 2005/0219177 A1    Oct. 6, 2005

Related U.S. Application Data

(63) Continuation of application No. 09/933,178, filed on Aug. 21, 2001, now Pat. No. 6,867,758.

(30) Foreign Application Priority Data

Nov. 23, 2000 (KR) ................ 2000-70084

(51) Int. Cl.
*G09G 3/36* (2006.01)
*G02F 1/1333* (2006.01)

(52) U.S. Cl. .................... 345/87; 345/206; 349/58

(58) Field of Classification Search .......... 345/87, 345/205, 204, 206; 369/56, 58, 59, 60; 349/58, 349/56
See application file for complete search history.

(56) References Cited

U.S. PATENT DOCUMENTS

| 6,466,282 B1 | 10/2002 | Sasuga et al. | 349/58 |
| 6,532,055 B1 * | 3/2003 | Oishi | 349/149 |
| 6,590,553 B1 | 7/2003 | Kimura et al. | 345/92 |

* cited by examiner

*Primary Examiner*—Dennis-Doon Chow
(74) *Attorney, Agent, or Firm*—F. Chau & Assoc., LLC

(57) ABSTRACT

A liquid crystal display device includes dual bank type source driver PCBs installed at the top and the bottom of a liquid crystal panel, a gate driver PCB, and a staple-shaped main PCB formed in a body with a top portion and a bottom portion proceeding in the horizontal direction and a side portion proceeding in the vertical direction. The top portion and the bottom portion of the main PCB axially meet the side portion of the main PCB at a predetermined angle. A timing controller is mounted at the main PCB to process signals input from outside and generate driving signals. The main PCB transmits the relevant driving signals to the respective source driver PCBs and the gate driver PCB.

7 Claims, 4 Drawing Sheets

LIQUID CRYSTAL DISPLAY DEVICE

CROSS REFERENCE TO PRIOR APPLICATIONS

This application is a Continuation Application of U.S. patent application Ser. No. 09/933,178 filed on Aug. 21, 2001 now U.S. Pat. No. 6,867,758, which claims priority to and the benefit of Korean Patent Application No. 2000-70084 filed on Nov. 23, 2000, which are hereby incorporated by reference for all purposes as if fully set forth herein.

BACKGROUND OF THE INVENTION (a) Field of the Invention

The present invention relates to a liquid crystal display device and, more particularly, to a liquid crystal display device which is provided with a printed circuit board (PCB) module adapted for a wide screen and high resolution device.

(b) Description of the Related Art

Generally, a liquid crystal display device includes a liquid crystal display module with a liquid crystal panel where liquid crystal cells are arranged between two glass substrates in a matrix form, and a backlight unit installed at the rear of the liquid crystal panel, a PCB module installed at the rear of the backlight unit to drive the liquid crystal panel, and a case covering the liquid crystal display module and the PCB module to protect them. The PCB module is a driving circuit that receives picture data of red (R), green (G) and blue (B) and synchronization signals from outside, and processes them to generate picture signals, scanning signals and timing control signals. The PCB module transmits the generated signals to the liquid crystal panel such that the latter can display the desired images in a stable manner. Such a PCB module is provided with a plurality of PCBs, and flexible printed cables (FPCs) interconnecting the PCBs for signal transmission.

FIG. 1 is a block diagram illustrating the circuit structure of a liquid crystal display device according to a prior art. As shown in FIG. 1, the PCB module for a display device bearing relatively lower resolution of SVGA (600*800) includes a main PCB 10, a gate driver PCB 20, and a source driver PCB 30 or 40. The main PCB 10 receives picture data of R, G and B and synchronization signals from the outside, and processes them by way of a timing controller (T-con) such that they are adapted for the structure of a liquid crystal panel 50. The timing controller is a custom IC in the form of a flat pin grid array (FPGA).

Gate driver IC tape automated bonds (TABs) are attached to the gate driver PCB 20 to receive gate driver control signals 60 and 61 from the main PCB 10, and to supply scanning signals to the liquid crystal panel 50 based on the received control signals 60 and 61. Source driver IC TABs are attached to the source driver PCB 30 or 40 to receive source driver control signals 70 and 71 from the main PCB 10, and to supply picture signals to the liquid crystal panel 50 based on the received control signals 70 and 71.

The PCB module further includes an FPC for transmitting the gate driver control signals 60 and 61 from the main PCB 10 to the gate driver PCB 20, and an FPC for transmitting the source driver control signals 70 and 71 from the main PCB 10 to the source driver PCB 30 or 40. In case the main PCB 10 is separated into two or more portions, other FPCs may be provided to interconnect the separated portions of the main PCB 10.

As the liquid crystal display device has been developed to bear a wide screen and a high resolution of XGA (768*1024), SXGA (1024*1280), or UXGA (1200*1600), a dual bank type PCB module is mainly used for such a display device because of the narrow width of data lines placed at a bottom substrate of the liquid crystal panel 50 and the space for driver IC TABS. The dual bank type PCB also allows a partitioned driving that enables high speed data processing. In the dual bank type PCB module, two source driver PCBs are installed at the rear of the liquid crystal panel 50 to supply picture signals from the top and the bottom.

FIGS. 2 and 3 illustrate the structure of a dual bank type PCB module for a liquid crystal display device, respectively.

As shown in FIG. 2, source driver PCBs 110 and 120 are installed at the rear of a liquid crystal display module 100 such that they are connected to an I-shaped main PCB 140 via FPCs 150 and 170, respectively. A gate driver PCB 130 is connected to the main PCB 140 via an FPC 160 side by side. The main PCB 140 has a timing controller to generate various kinds of data and control signals, and supply them to the source driver PCBs 110 and 120 and the gate driver PCB 130 via the FPCs 150, 160 and 170.

As shown in FIG. 3, source driver PCBs 210 and 220 are installed at the rear of a liquid crystal display module 200 such that they are connected to three main PCBs 240, 241 and 242 via FPCs 250 and 280, respectively. A gate driver PCB 230 is connected to the main PCB 240 via an FPC 290 side by side. The main PCBs 240, 241 and 242 are provided with a timing controller to generate various kinds of data signals and control signals, and supply them to the source driver PCBs 210 and 220 and the gate driver PCB 230 via the FPCs 250, 260, 270, 280 and 290.

However, in the usual dual bank type PCB module shown in FIG. 2, the transmission of the picture data is delayed at the right screen portion when viewed from the front side so that normal display cannot be made. In order to overcome such a problem, as shown in FIG. 3, it is proposed that three separate main PCBs 240, 241 and 242 should be introduced and interconnected via two FPCs 260 and 270. A space for mounting driver IC TABs, signal lines, resistors and condensers is provided at the source driver PCBs 210 and 220, and the main PCBs 240, 241 and 242 are designed in consideration of intersignal coupling, noise, and electromagnetic interference (EMI) such that the required signal transmission can be made within the range of tolerance. However, even in such a structure, signal delay or distortion tends to generate due to the delay factor intrinsic to resistance capacitance (RC) from interconnecting the PCBs by the FPCs 260 and 270. The RC may accrue to the combination resistance of the PCB connector and the FPC connector, and other parasitic capacitance. Consequently, the signals applied to the source driver PCBs 210 and 220 are not timing-controlled in a stable manner so that setting and holding of the picture data become to be inappropriate for displaying, resulting in serious display failure accompanied with screen noise and line defect.

Meanwhile, the usual liquid crystal display screen is formed in a rectangular shape where the ratio of the horizontal length to the vertical length is 4:3, or 16:9. However, in near future, it is expected that the display screen for medical equipment and radar where screen size and resolution become bigger and higher with a longer vertical length may be required in a square shape. Accordingly, the number of horizontal lines per frame increases in signal processing. Hence, one horizontal synchronization signal cycle becomes shorter to reduce the period of time for processing the picture data. This decreases timing margin. In this respect, it is required to develop a technique that processes the picture data within the range of signal delay and distortion tolerance, while preventing screen noise, coupling, and EMI.

SUMMARY OF THE INVENTION

It is an object of the present invention to provide a liquid crystal display device that can reduce signal delay and distortion in driving a liquid crystal panel having a wide screen and a high resolution.

This and other objects may be achieved by a liquid crystal display device with the following features.

The liquid crystal display device includes dual bank type source driver PCBs installed at the top and the bottom of a liquid crystal panel, a gate driver PCB, and a staple-shaped main PCB formed in a body with top and bottom portions proceeding in the horizontal direction and a side portion proceeding in the vertical direction. The top and the bottom portions of the main PCB axially meet the side portion of the main PCB at a predetermined angle. A timing controller is mounted at the main PCB to process signals input from the outside and generate driving signals. The main PCB transmits the relevant driving signals to the respective source driver PCBs and the gate driver PCB.

The top and bottom portions of the main PCB axially meet the side portion of the main PCB substantially at a right angle. Alternatively, the top and the bottom portions of the staple-shaped main PCB may axially meet the side portion of the main PCB at an acute angle, or an obtuse angle. The top and bottom portions of the staple-shaped main PCB have an axial length of one half or more of the liquid crystal panel.

The respective top and bottom portions of the staple-shaped main PCB are connected to the corresponding source driver PCBs via one or more FPCs to transmit the relevant driving signals to the source driver PCBs.

The side portion of the staple-shaped main PCB is connected to the gate driver PCB via one or more FPCs to transmit the relevant driving signals to the gate driver PCB. The timing controller is positioned at the side portion of the staple-shaped main PCB.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE PREFERRED EMBODIMENTS

Preferred embodiments of this invention will be explained with reference to the accompanying drawings.

Figure 4:
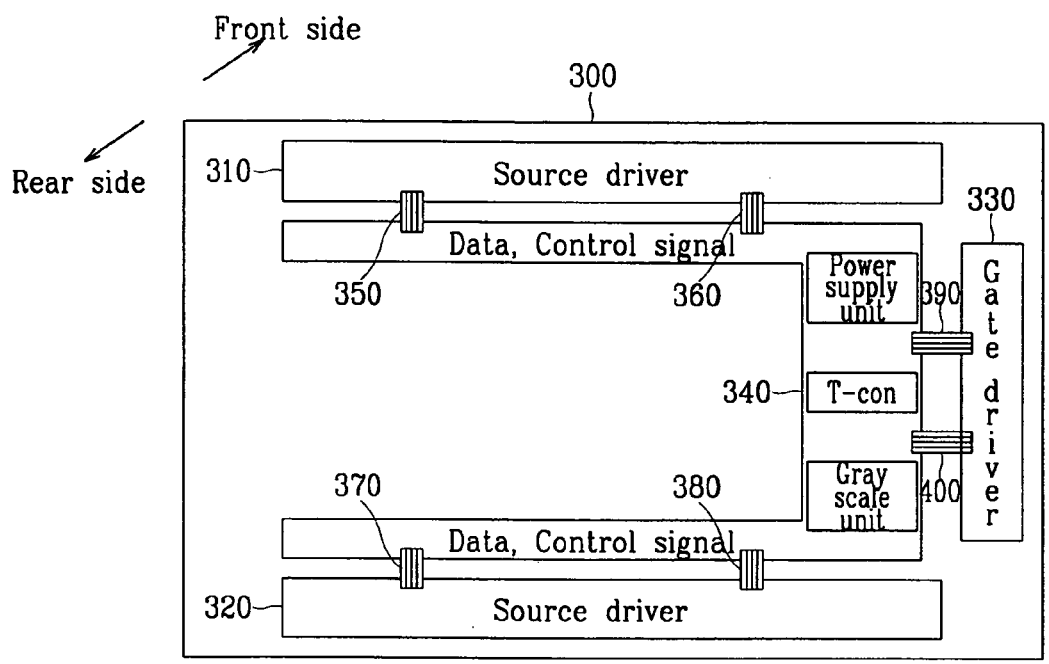
FIG. 4 is a block diagram of a PCB module for a liquid crystal display device according to a preferred embodiment of the present invention.

FIG. 4 is a block diagram of a liquid crystal display device according to a preferred embodiment of the present invention.

As shown in FIG. 4, the liquid crystal display device includes a liquid crystal display module 300, a staple-shaped main PCB 340, first and second source driver PCBs 310 and 320 installed at the rear of the liquid crystal display module 300 up and down such that they are connected to the main PCB 340 via first, second, third and fourth source FPCs 350, 360, 370 and 380, and a gate driver PCB 330 connected to the main PCB 340 via gate FPCs 390 and 400 side by side. The main PCB 340 generates various kinds of data signals and control signals, and supplies them to the source driver PCBs 310 and 320 and the gate driver PCB 330 via the FPCs 350, 360, 370, 380, 390 and 400.

The liquid crystal module 300 includes a liquid crystal panel where liquid crystal cells are arranged between two glass substrates in a matrix form, and a backlight unit installed at the rear of the liquid crystal panel.

Figure 6:
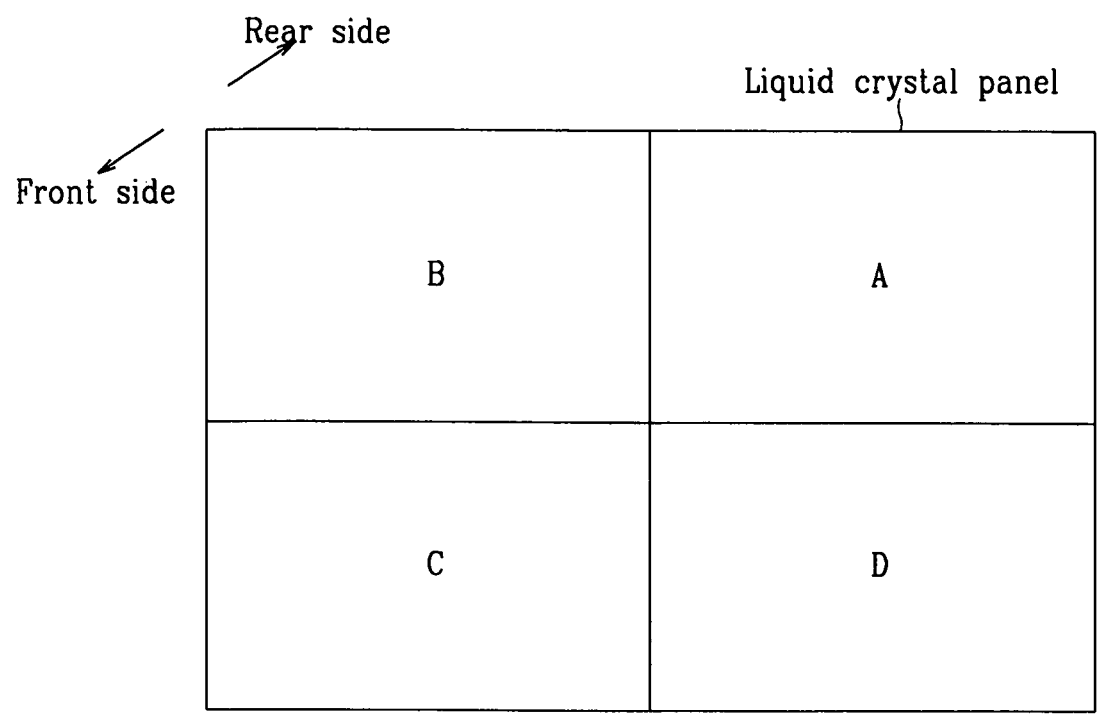
FIG. 6 illustrates a way of partitioning a liquid crystal panel for the liquid crystal display device shown in FIG. 4.

Source driver IC TABs are attached to the first source driver PCB 310 to receive driving signals from the main PCB 340, and to supply picture data to the corresponding pixels of the liquid crystal panel based on the received driving signals. How to correspond the pixels with the picture data depends upon the ways of driving. For instance, if the pixels are driven in a double-partitioned way, the corresponding pixels may be the odd-numbered pixels from the left on the horizontal axis of the liquid crystal panel. As shown in FIG. 6, if the pixels are driven in a quadruple-partitioned way, the corresponding pixels may be the pixels positioned at the top portions A and B of the liquid crystal panel.

Source driver IC TABs are also attached to the second source driver PCB 320 to receive driving signals from the main PCB 340, and to supply picture data to the corresponding pixels of the liquid crystal panel based on the received driving signals. How to correspond the pixels with the picture data depends upon the ways of driving. For instance, if the pixels are driven in a double-partitioned way, the corresponding pixels may be the even-numbered pixels from the left on the horizontal axis of the liquid crystal panel. As shown in FIG. 6, in case the pixels are driven in a quadruple-partitioned way, the corresponding pixels may be the pixels positioned at the bottom portions C and D of the liquid crystal panel.

Gate driver IC TABs are attached to the gate driver PCB 330 to receive gate driver control signals from the main PCB 340, and to supply scanning signals to the liquid crystal panel based on the received control signals.

A timing controller is provided at the main PCB 340 to process the input signals from outside and to generate driving signals. The driving signals are supplied to the first source driver PCB 310, the second source driver PCB 320, and the gate driver PCB 330. The main PCB 340 is formed in a body without any interconnection cable such as FPC while bearing a staple shape of "⊂" or "⊃" when viewed either in the display direction or the other way. That is, the main PCB 340 has top and bottom portions proceeding in the horizontal direction, and a side portion proceeding in the vertical direction. The top and bottom portions of the main PCB 340 axially meet the side portion thereof at a right angle, or at an acute or obtuse angle. The first source FPC 350 and the second source FPC 360 are flexible cables that transmit picture data and various kinds of control signals from the main PCB 340 to the first source driver PCB 310 to drive the source driver IC TABs attached thereto. As shown in FIG. 6, if the liquid crystal panel is driven in a quadruple-partitioned way, the first source FPC 350 transmits the picture data and control signals generated from the main PCB 340 to the first source driver PCB 310 to drive the source driver IC TAB corresponding to the A portion of the liquid crystal panel. The second source FPC 360 transmits the picture data and control signals generated from the main PCB 340 to the first source driver PCB 310 to drive the source driver IC TAB corresponding to the B portion of the liquid crystal panel.

The third source FPC 370 and the fourth source FPC 380 are flexible cables that transmit picture data and various kinds of control signals from the main PCB 340 to the second source driver PCB 320 to drive the source driver IC TABs attached thereto. As shown in FIG. 6, if the liquid crystal panel is driven in a quadruple-partitioned way, the third source FPC 370 transmits the picture data and control signals generated from the main PCB 340 to the second source driver PCB 320 to drive the source driver IC TAB corresponding to the C portion of the liquid crystal panel. The fourth source FPC 380 transmits the picture data and control signals generated from the main PCB 340 to the second source driver PCB 320 to drive the source driver IC TAB corresponding to the D portion of the liquid crystal panel.

The first gate FPC 390 and the second gate FPC 400 are flexible cables that transmit power and various kinds of control signals from the main PCB 340 to the gate driver PCB 330 to drive the gate driver IC TABs attached thereto. As shown in FIG. 6, if the liquid crystal panel is driven in a quadruple-partitioned way, the first gate FPC 390 transmits the power and control signals generated from the main PCB 340 to the gate driver PCB 330 to drive the gate driver IC TAB corresponding to the A and B portions of the liquid crystal panel. The second gate FPC 400 transmits the power and control signals generated from the main PCB 340 to the gate driver PCB 330 to drive the gate driver IC TAB corresponding to the C and D portions of the liquid crystal panel.

In operation, upon receipt of input signals from outside, the main PCB 340 processes the input signals by way of a built-in timing controller, and generates picture data and various kinds of control signals. The main PCB 340 transmits part of the picture data and control signals to the first source driver PCB 310 via the first and second source FPCs 350 and 360 while transmitting part of the picture data and control signals to the second source driver PCB 320 via the third and fourth source FPCs 370 and 380. The main PCB 340 generates power and various kinds of control signals for driving gate driver IC TABs attached to the gate driver PCB 330, and transmits them to the gate driver PCB 330 via the first and second gate FPCs 390 and 400.

Figure 5:
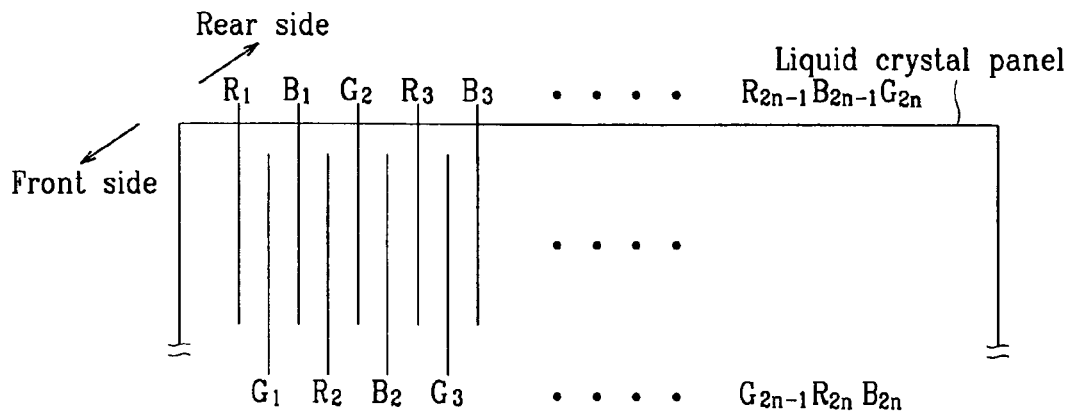
FIG. 5 illustrates an arrangement of picture data supplied from source drivers of the PCB module shown in FIG. 4.

When the liquid crystal panel is driven in a double-partitioned way, the odd-numbered picture data $R_{2n-1}$, $G_{2n}$ and $B_{2n-1}$ generated at the main PCB 340 are transmitted to the first source driver PCB 310 via the first and second source FPCs 350 and 360. And the even-numbered picture data $R_{2n}$, $G_{2n-1}$ and $B_{2n}$ are transmitted to the second source driver PCB 320 via the third and fourth FPCs 370 and 380. FIG. 5 illustrates the sequence of displaying picture data at the pixels of the liquid crystal panel.

By contrast, as shown in FIG. 6, if the liquid crystal panel is driven in a quadruple-partitioned way, the first source FPC 350 transmits the picture data and control signals generated from the main PCB 340 to the first source driver PCB 310 to drive the source driver IC TAB corresponding to the A portion of the liquid crystal panel. The second source FPC 360 transmits the picture data and control signals generated from the main PCB 340 to the first source driver PCB 310 to drive the source driver IC TAB corresponding to the B portion of the liquid crystal panel. The third source FPC 370 transmits the picture data and control signals generated from the main PCB 340 to the second source driver PCB 320 to drive the source driver IC TAB corresponding to the C portion of the liquid crystal panel. The fourth source FPC 380 transmits the picture data and control signals generated from the main PCB 340 to the second source driver PCB 320 to drive the source driver IC TAB corresponding to the D portion of the liquid crystal panel. Furthermore, the first gate FPC 390 transmits the power and control signals generated from the main PCB 340 to the gate driver PCB 330 to drive the gate driver IC TAB corresponding to the A and B portions of the liquid crystal panel. The second gate FPC 400 transmits the power and control signals generated from the main PCB 340 to the gate driver PCB 330 to drive the gate driver IC TAB corresponding to the C and D portions of the liquid crystal panel.

The main PCB 340 is connected to the first source driver PCB 310 via the first and second source FPCs 350 and 360 while being connected to the second source driver PCB 320 via the third and fourth FPCs 370 and 380. It is such structured to supply picture data without signal delay in the liquid crystal panel with a screen size of 20 inch or more, and a high resolution.

Figure 1:
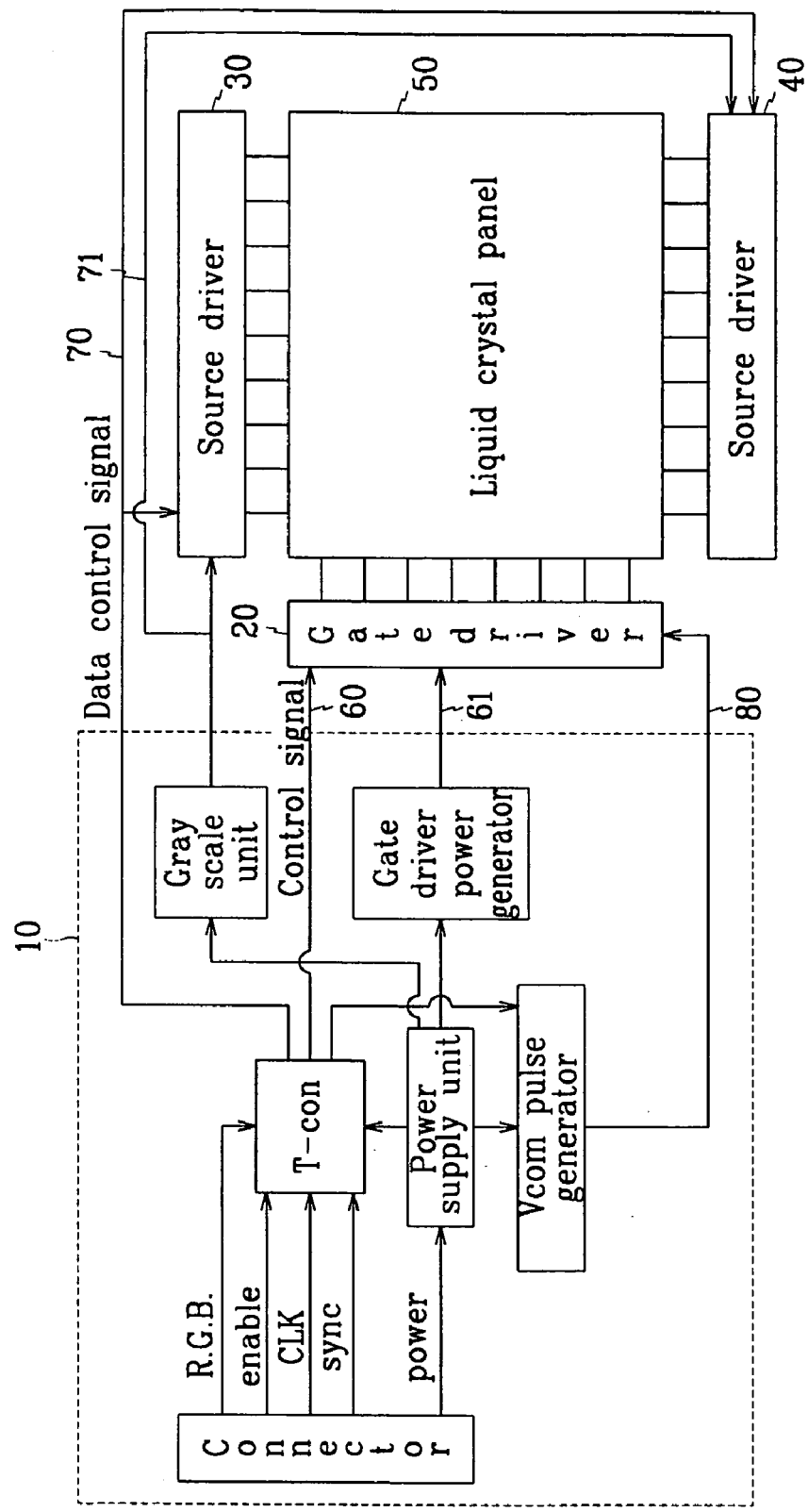
FIG. 1 is a block diagram illustrating the circuit structure of a liquid crystal display according to a prior art.
Figure 2:
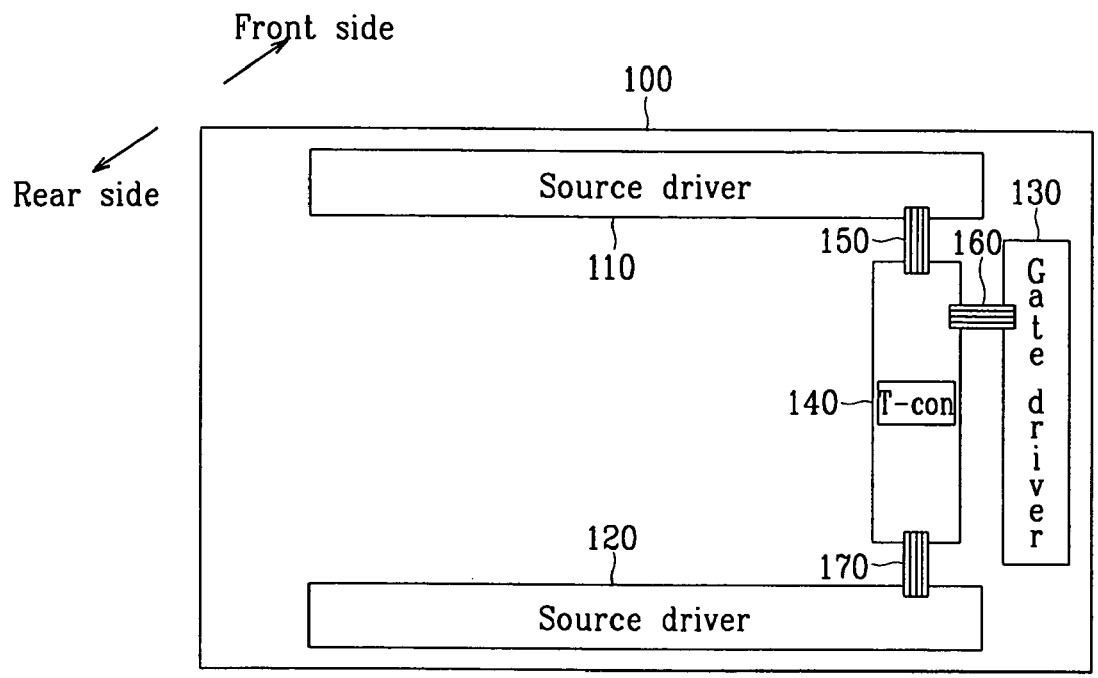
FIG. 2 is a block diagram of a PCB module for the liquid crystal display device shown in FIG. 1.
Figure 3:
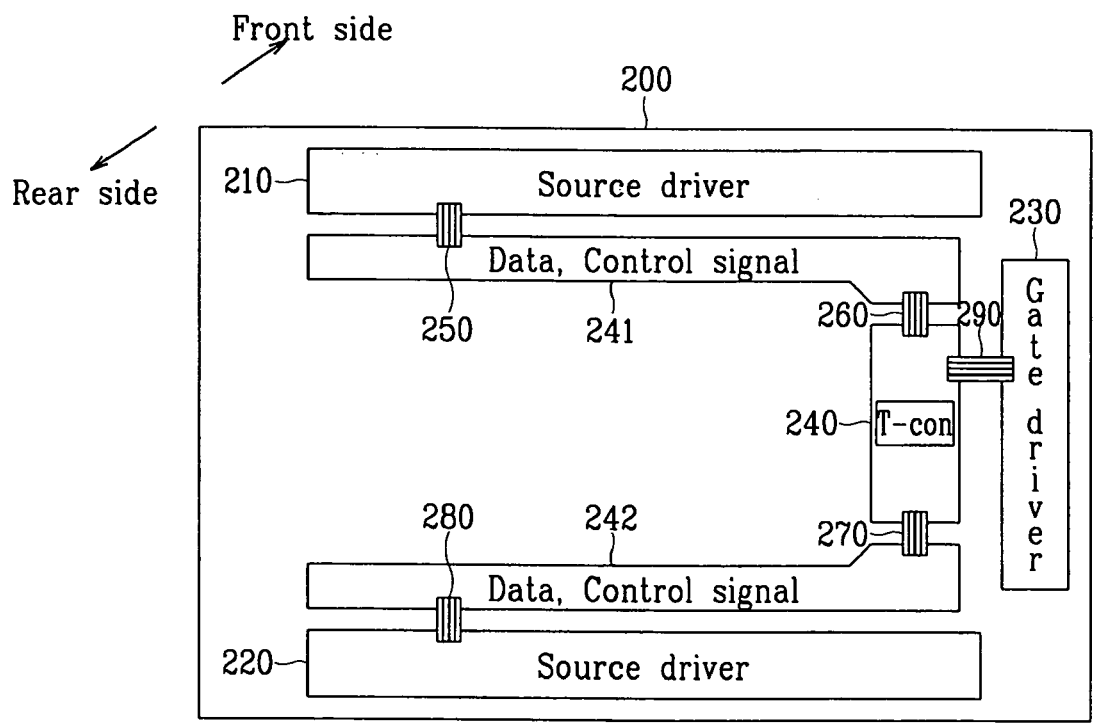
FIG. 3 is a block diagram of another PCB module for the liquid crystal display device shown in FIG. 1.

As described earlier, even in the configuration of the main PCBs 240, 241 and 242 as shown in FIG. 3, signal delay or distortion tends to generate due to the delay factor intrinsic to the RC by interconnecting the PCBs with the FPCs 260 and 270. Consequently, the signals applied to the source driver PCBs 210 and 220 are not controlled timely in a stable manner. This sets and holds the picture data inappropriately for displaying, resulting in serious display failure as well as screen noises and line defects.

In view of such a problem, the main PCB 340 is formed in a staple shape to be connected to the first source driver PCB 310 via the first and second source FPCs 350 and 360 while being connected to the second source driver PCB 320 via the third and fourth FPCs 370 and 380. Furthermore, the main PCB 340 is designed considering intersignal coupling, noise and EMI, Thus, signals can be supplied within the tolerance range of the source driver PCBs 310 and 320.

Particularly, in a quadruple-partitioned way driving, the problems of intersignal coupling, noise and EMI become more amplified. That is, in the top area of the liquid crystal panel, the source driver IC TABs attached to the source driver PCB 310 differ in driving the A portion and the B portion of the liquid crystal panel. And the number of signal lines for transmitting the different picture data and control signals to the respective IC TABs amounts to several tens of lines. Similarly, in the bottom area of the liquid crystal panel, the source driver IC TABs for driving the C portion and the D portion of the liquid crystal display panel are also different, and the number of signal lines for supplying the different picture data and control signals amounts to several tens of lines. Therefore, it is necessary that the main PCB 340 should be connected to the first source driver PCB 310 via the first and second source FPCs 350 and 360 while being connected to the second source driver PCB 320 via the third and fourth FPCs 370 and 380. In this structure, the main PCB 340 can supply signals within the tolerance range of the source driver PCBs 310 and 320. Furthermore, the source driver PCBs 310 and 320 are structured to have a sufficient space for receiving the driver IC TABs, the signal lines, and resistors or condensers for giving bias to the respective signal voltages in an appropriate manner.

The top and bottom portions of the staple-shaped main PCB 340 have an axial length amounting to one half or more of the liquid crystal panel. The second source FPC 360 and the fourth source FPC 380 interconnecting the first and second source driver PCBs 310 and 320 are positioned at the area that is less than one half of the entire axial length of the top and bottom portions of the main PCB 340 from the side portion thereof. The first source FPC 350 and the third source FPC 370 interconnecting the first and second source driver PCBs 310 and 320 are positioned at the area that is one half or more of the entire axial length of the top and bottom portions of the main PCB 340 from the side portion thereof. In this structure, the possible problems of intersignal coupling, noise, and EMI can be prevented in an efficient manner.

As described above, in driving a liquid crystal panel with a dual bank type PCB module in a double or quadruple-partitioned way, the staple-shaped main PCB 340 minimizes signal delay and distortion while preventing the possible problems of intersignal coupling, noise, and EMI in an efficient manner. Accordingly, such a main PCB can be well adapted for driving 20 inch or larger high resolution liquid crystal panels as well as square-shaped liquid crystal panels.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A liquid crystal display (LCD), comprising:
a main printed circuit board (PCB) including a first portion extending in a first direction, a second portion extending in the first direction, and a third portion extending in a second direction and bridging the first portion and the second portion;
a first source driver PCB arranged close to the first portion of the main PCB that has an axial length at least one half of the first source driver PCB;
a second source driver PCB arranged close to the second portion of the main PCB that has an axial length at least one half of the second source driver PCB;
first, second, third, and fourth source cables, wherein the first and third source cables connect the first and second portions of the main PCB with the first and second source driver PCB, respectively, and are positioned at locations that are one half or more of the entire axial length of the first and second portions of the main PCB from the third portion thereof, and wherein the second and fourth source cables connect the first and second portions of the main PCB, respectively and are positioned at locations that are less than one half of the entire axial length of the first and second portions of the main PCB from the third portion thereof;
a gate driver PCB;
a first gate driver cable connected between the main PCB and the gate driver PCB; and
a second gate driver cable connected between the main PCB and the gate driver PCB.

2. The LCD of claim 1, wherein the first direction is perpendicular to the second direction.

3. The LCD of claim 1, where the main PCB further comprises a timing controller mounted on the third portion and generating a gate driving signal, a first source driving signal and a second source driving signal.

4. The LCD of claim 1, wherein the third source cable and the fourth source cable are flexible printed cables (FPCs).

5. The LCD of claim 1, wherein the first source cable and the second source cable are flexible printed cables (FPCs).

6. A liquid crystal display (LCD), comprising:
a liquid display panel divided into a plurality of partitions arranged in a matrix including a plurality of rows and a plurality columns;
a main printed circuit board (PCB) including a first portion extending in a first direction, a second portion extending in the first direction, and a third portion extending in a second direction and bridging the first portion and the second portion;
a first source driver PCB arranged close to the first portion of the main PCB that has an axial length at least one half of the first source driver PCB;
a second source driver PCB arranged close to the second portion of the main PCB that has an axial length at least one half of the second source driver PCB;
first, second, third, and fourth source cables, wherein the first and third source cables connect the first and second portions of the main PCB with the first and second source driver PCB, respectively, and are positioned at locations that are one half or more of the entire axial length of the first and second portions of the main PCB from the third portion thereof, and wherein the second and fourth source cables connect the first and second portions of the main PCB, respectively and are positioned at locations that are less than one half of the entire axial length of the first and second portions of the main PCB from the third portion thereof;
a gate driver PCB; and
a plurality of gate driver cables coupled between the third portion of the main PCB and the gate driver PCB, each gate driver cable transferring a signal for the corresponding partition.

7. A liquid crystal display (LCD), comprising:
a main printed circuit board (PCB) including a first portion extending in a first direction, a second portion extending in the first direction, and a third portion extending in a second direction and bridging the first portion and the second portion;
a first source driver PCB arranged close to the first portion of the main PCB that has an axial length at least one half of the first source driver PCB;
a second source driver PCB arranged close to the second portion of the main PCB that has an axial length at least one half of the second source driver PCB;
first, second, third, and fourth source cables, wherein the first and third source cables connect the first and second portions of the main PCB with the first and second source driver PCB, respectively, and are positioned at locations that are one half or more of the entire axial length of the first and second portions of the main PCB from the third portion thereof, and wherein the second and fourth source cables connect the first and second portions of the main PCB, respectively and are positioned at locations that are less than one half of the entire axial length of the first and second portions of the main PCB from the third portion thereof;
a gate driver PCB; and
a plurality of cables connected between the main PCB and the gate driver PCB.

* * * * *